(12) United States Patent
Quirke et al.

(10) Patent No.: US 6,676,485 B1
(45) Date of Patent: *Jan. 13, 2004

(54) WET INJECTING FINE ABRASIVES FOR WATER JET CURVED CUTTING OF VERY BRITTLE MATERIALS

(75) Inventors: David J. Quirke, San Jose, CA (US); Robert Cole, Mt. Hamilton, CA (US)

(73) Assignee: Lightwave Microsystems Corporation, San Jose, CA (US)

( * ) Notice: Subject to any disclaimer, the term of this patent is extended or adjusted under 35 U.S.C. 154(b) by 187 days.

This patent is subject to a terminal disclaimer.

(21) Appl. No.: 09/885,355

(22) Filed: Jun. 20, 2001

Related U.S. Application Data

(63) Continuation-in-part of application No. 09/693,347, filed on Oct. 20, 2000.

(51) Int. Cl.[7] .................................................. B24C 1/00
(52) U.S. Cl. ............................ 451/38; 451/40; 451/75; 451/102
(58) Field of Search ........................... 451/36, 38, 39, 451/40, 5, 6, 1, 2, 8, 9, 10, 75, 80, 99, 102

(56) References Cited

U.S. PATENT DOCUMENTS

| | | | |
|---|---|---|---|
| 3,564,190 A | * 2/1971 | Kandajan et al. | 205/662 |
| 3,694,972 A | * 10/1972 | Emeis | 451/38 |
| 3,953,941 A | * 5/1976 | Kuhn et al. | 451/2 |
| 4,101,405 A | * 7/1978 | Inoue | 204/224 M |
| 4,478,368 A | 10/1984 | Yie | |
| 4,548,001 A | * 10/1985 | Link | 451/38 |
| 4,555,872 A | 12/1985 | Yie | |
| 4,648,215 A | 3/1987 | Hashish et al. | |
| 5,117,366 A | * 5/1992 | Stong | 700/160 |
| 5,184,434 A | * 2/1993 | Hollinger et al. | 451/36 |
| 5,279,075 A | * 1/1994 | Sage et al. | 451/2 |
| 5,325,638 A | * 7/1994 | Lynn | 451/39 |
| 5,527,204 A | 6/1996 | Rhoades | |
| 5,637,030 A | 6/1997 | Chopra et al. | |
| 5,679,058 A | 10/1997 | Rhoades | |
| 5,782,673 A | 7/1998 | Warehime | |
| 5,908,349 A | 6/1999 | Warehime | |
| 6,007,639 A | * 12/1999 | Logan, Jr. | 134/7 |
| 6,014,965 A | * 1/2000 | Nishida | 125/12 |
| 6,077,152 A | 6/2000 | Warehime | |
| 6,080,907 A | 6/2000 | Miller | |
| 6,306,011 B1 | * 10/2001 | Perry et al. | 451/38 |
| 6,379,214 B1 | * 4/2002 | Stewart et al. | 451/2 |

* cited by examiner

Primary Examiner—Joseph J. Hail, III
Assistant Examiner—Hadi Shakeri
(74) Attorney, Agent, or Firm—Amin & Turocy, LLP

(57) ABSTRACT

The present invention relates to methods and systems for isolating non-rectangular shaped optical integrated circuits formed on a brittle substrate. For example, a brittle substrate comprising a plurality of non-rectangular shaped optical integrated circuits is provided on a water jet cutting system. In the cutting head of the water jet cutting system, a mixture of water and abrasive particles is wet injected into a supply of a high pressure water stream. The non-rectangular shaped optical integrated circuits are isolated by water jet cutting in a curvilinear manner without fatally damaging adjacent optical integrated circuits.

20 Claims, 7 Drawing Sheets

WET INJECTING FINE ABRASIVES FOR WATER JET CURVED CUTTING OF VERY BRITTLE MATERIALS

RELATED APPLICATIONS

This application is a continuation-in-part of currently pending application Ser. No. 09/693,347 filed Oct. 20, 2000.

FIELD OF THE INVENTION

The present invention generally relates to fabricating optical integrated circuits. In particular, the present invention relates to efficiently isolating optical integrated circuits with high yields from substrates.

BACKGROUND OF THE INVENTION

Abrasive water jets are commonly employed in cutting and machining operations, particularly with metal sheet and plates to effect rapid and economical cutting and related forming operations. Typical applications include cutting materials which are difficult to machine, such as stainless steels, titanium, nickel alloys, reinforced polymer composites, and the like. Such techniques are particularly advantageous to produce cutting action through very highly localized action and without delamination of composite materials.

To effect abrasive water jet cutting, a specialized nozzle assembly is employed to direct a high pressure stream through an orifice to form a water jet. Typical nozzle assemblies are formed of abrasion resistant materials, such as tungsten carbide. The orifice itself may be formed of diamond or sapphire. Abrasive particles are added to the high speed stream of water exiting the nozzle orifice by dry injection into the water stream near or in the nozzle. Although a turbulent flow is created where the particles contact the stream, the relatively stationary or slow moving abrasive particles are accelerated and become entrained in the high speed water stream. The entrainment process tends to disperse and decelerate the water stream while the abrasive particles collide with the nozzle wall and with each other. However, relatively wide kerfs undesirably result from the dispersed jet streams. Furthermore, energy is wasted when a dispersed stream is employed, and the nozzle is rapidly worn, even when made from abrasion resistant materials, such as tungsten carbide and the like.

While it may be desirable in some instances to employ abrasives in water jets, dry injecting abrasive particles into a water stream often results in clogging of the cutting head and/or nozzle. And the smaller the abrasive particles, the more likely clogging occurs.

Planar lightwave circuits (PLCs) are optical circuits laid out on a silicon wafer. PLCs, which typically contain one or more planar waveguides often used in arrayed waveguide gratings, are used as components in constructing an optical communication system. Optical communication systems permit the transmission of large quantities of information. With ever increasing internet traffic, greater demands are placed on optical communication systems, and their corresponding components.

A plurality of optical integrated circuits (OICs) including PLCs are typically fabricated on a single substrate or wafer. For example, a substrate may be fabricated with 30 to 40 OICs thereon. Individual OICs are isolated using a specialized saw to dice the substrate. However, OICs have a regular (consistent), non-rectangular geometry. Straight-line dicing using a saw consequently leads to the inefficient isolation of individual OICs from a substrate. Referring to FIG. 1, a substrate 100 with a plurality of PLCs 102 thereon is shown. Referring to FIG. 2, when individual PLCs 102 are isolated from the substrate 100 using a saw (square dicing), several PLCs 104 are destroyed while only one PLC 106 is recovered. Often times, two to four PLCs are destroyed for each PLC that is recovered.

Moreover, unlike machining metal substrates, PLC substrates and the components thereon are often made of monocrystalline silicon, silicon dioxide, various oxides and silicates, and other materials that have a very brittle nature. The brittle nature of such materials results in cracks and chips in the substrate or the components thereon. Since a plurality of OICs are fabricated in close proximity to one another, even small chips and cracks can render the OICs fatally defective. Cutting the brittle materials thus requires a high degree of care so as not to destroy the substrate. For this reason, specialized saws are employed to cut PLC substrates.

There is an unmet need in the to art to improve the current yields of OICs/PLCs from substrates.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter. The present invention provides methods and systems for curvilinear cutting of brittle materials that permits the isolation of OICs from a substrate with high yield. The present invention provides methods and systems for curvilinear cutting of brittle materials while mitigating or eliminating edge chipping, cracking, and other degrading effects. Wet injecting abrasives into a water jet cutter improves the cut quality of brittle materials. Wet injecting abrasives into a water jet cutter also minimizes clogging of the cutting head. As a result, the present invention maximizes the yield of non-rectangular OICs from a single substrate. The present invention also correspondingly promotes maximizing the number of non-rectangular OICs that may be fabricated on a single substrate since isolation thereof in high yield is enabled.

One aspect of the invention relates to a method of cutting a brittle substrate comprising a non-rectangular shaped optical integrated circuit, involving providing the brittle substrate comprising a plurality of non-rectangular shaped optical integrated circuits on a water jet cutting system, the brittle substrate positioned proximate a cutting head of the water jet cutting system; supplying a high pressure water stream to the cutting head; wet injecting a mixture of water and abrasive particles into the water stream in the cutting head; and abrasive water jet cutting the brittle substrate in a curvilinear manner to separate at least one of the plurality of non-rectangular shaped optical integrated circuits without fatally damaging an adjacent optical integrated circuit.

Another aspect of the invention relates to a system for separating a plurality of non-rectangular shaped optical integrated circuits formed on a brittle substrate. The system contains a brittle substrate holder for holding the brittle substrate comprising the plurality of optical integrated circuits; a supply of a mixture of water and abrasive particles; an agitator to promote suspension of the abrasive particles in water in the supply; a water line from a water supply to a cutting head; a second line from the supply of the mixture to the cutting head; and the cutting head comprising a chamber for receiving water from the water line and the mixture from the second line, the cutting head comprising a nozzle for expelling a jet stream under pressure for cutting the brittle substrate in a curvilinear manner, at least one of the brittle substrate holder and the cutting head movable in a curvilinear manner.

Yet another aspect of the invention relates to a method of water jet cutting a silicon substrate in a curvilinear manner, involving providing the silicon substrate on a water jet cutting system, the silicon substrate positioned proximate a cutting head having an orifice of the water jet cutting system; supplying a high pressure water stream to the cutting head; wet injecting a mixture of water and abrasive particles into the water stream in the cutting head to expel an abrasive water jet from the orifice to contact the silicon substrate, wherein the abrasive particles have an average diameter of about 53 µm or less; and moving the silicon substrate in a curvilinear manner in relation to the cutting head to cut the silicon substrate in a curvilinear manner while reducing at least one of chipping the silicon substrate and cracking the silicon substrate.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
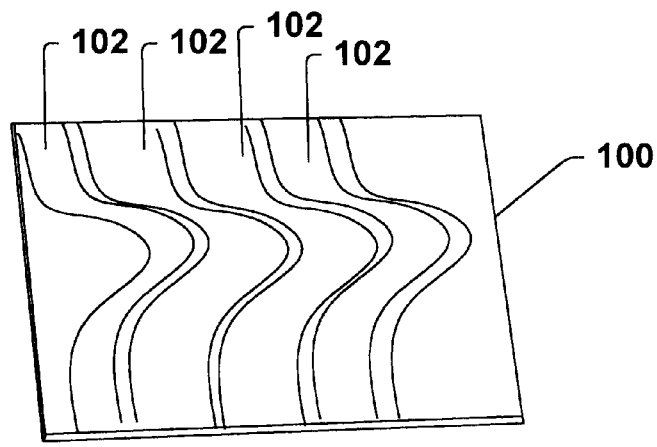
FIG. 1 illustrates a top-down view of an OIC substrate with a plurality of OICs thereon.
Figure 2:
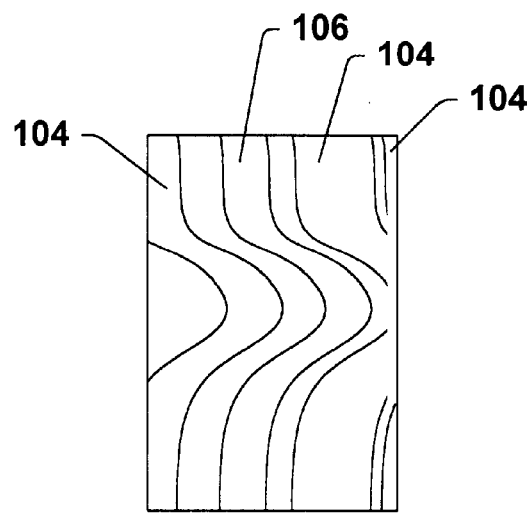
FIG. 2 illustrates a conventional manner of cutting an OIC substrate.
Figure 3:
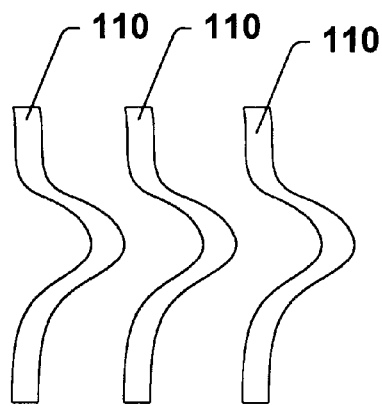
FIG. 3 illustrates OICs diced in accordance with one aspect of the present invention.

The present invention involves wet injecting fine abrasive particles into the cutting head of a water jet cutter to facilitate curvilinear cutting of brittle materials such as OICs from a substrate while minimizing chipping and cracking of the substrate and clogging of the jet cutter. Referring again to FIG. 1, a substrate 100 with a plurality of PLCs 102 thereon is shown. Referring now to FIG. 3, all or substantially all of the individual PLCs 110 may be cut and isolated from the substrate 100. Curvilinear cutting is conducted to separate the non-rectangular shaped optical devices from each other. Non-rectangular shapes include shapes having at least one curvilinear edge (not straight), such as the individual PLCs 110 of FIG. 3.

Figure 4:
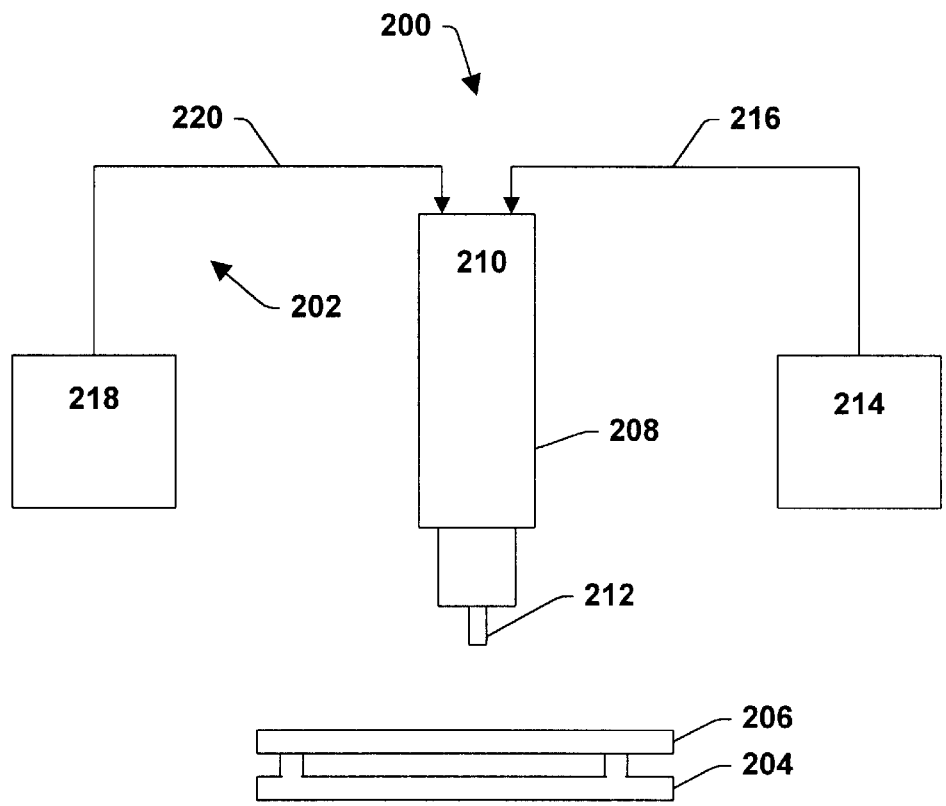
FIG. 4 illustrates a high level schematic of a water jet cutting system in accordance with one aspect of the present invention.

Referring to FIG. 4, a high level schematic of a water jet cutting system 200 in accordance with the present invention is shown. Water jet cutting system 200 includes a substrate holder 204 for securing a substrate 206 that will be diced using the system 200. The substrate 206 typically contains a plurality of optical devices (not shown, but see FIG. 1) thereon. Water jet cutting system 200 also includes wet abrasive injection system 202, water source 214 for supplying water used in the cutting operation, water supply tube 216 for delivering water from the water source 214 to the cutting head 208, cutting head 208 including a mixing/receiving chamber 210 and nozzle 212. Water source 214 may be a water supply such as a tap, or a storage container. Water from the water source 214 may or may not be pretreated (such as filtered, purified, softened, and the like). Although not shown, a force is imposed on the water traveling through the cutting head 208 in any suitable manner so that a fine high pressure stream of water is expelled from the nozzle 212. For example, water from the water source 214 may travel through a pump where it is then delivered to the cutting head 208 under high pressure.

The wet abrasive injection system 202 includes a storage device 218 for housing a mixture of abrasive particles and water and a delivery tube 220 for delivering the mixture of abrasive particles and water from the storage device 218 to the cutting head 208. Alternatively, the wet abrasive injection system 202 may be separate from the water jet cutting system 200 but connected to the system 200.

In the cutting head 208, the mixture of abrasive particles and water from storage device 218 mixes and is entrained by the water traveling therethrough from the water source 214. The combination under suitable force forms a high pressure abrasive water jet as it is expelled from the nozzle 212. While not wishing to be bound by any theory, it is believed that the introduction of abrasive into the main water stream is facilitated as the abrasive particles are surrounded by water and thus do not have to undergo wetting in order to effectively combine with the main water stream. Alternatively and/or additionally, less turbulence is created and increased laminar flow is created when wet injecting abrasives in water compared to dry injection. Rapid entrainment/wetting of abrasive and/or less turbulence in the cutting head minimizes clogging, even when relatively small abrasives are employed. Moreover, rapid entrainment/wetting of abrasive and/or less turbulence in the cutting head leads to the production of fine water jets that can cut brittle materials such as OICs while minimizing instances of cracking and chipping.

Figure 5:
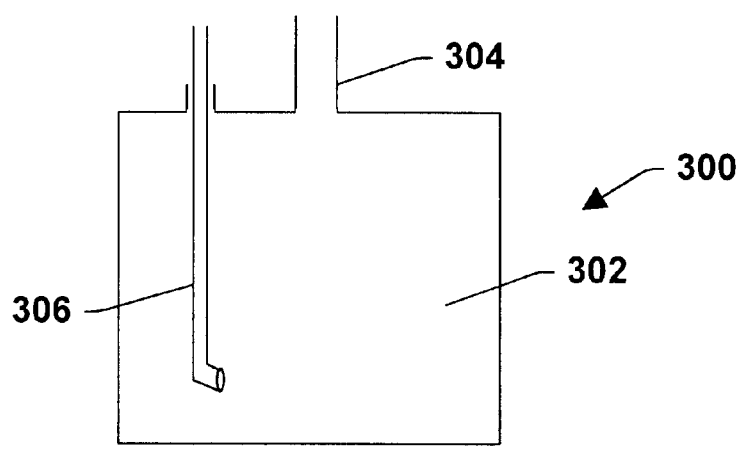
FIG. 5 illustrates a storage device containing a mixture of abrasive particles and water in accordance with one aspect of the present invention.
Figure 6:
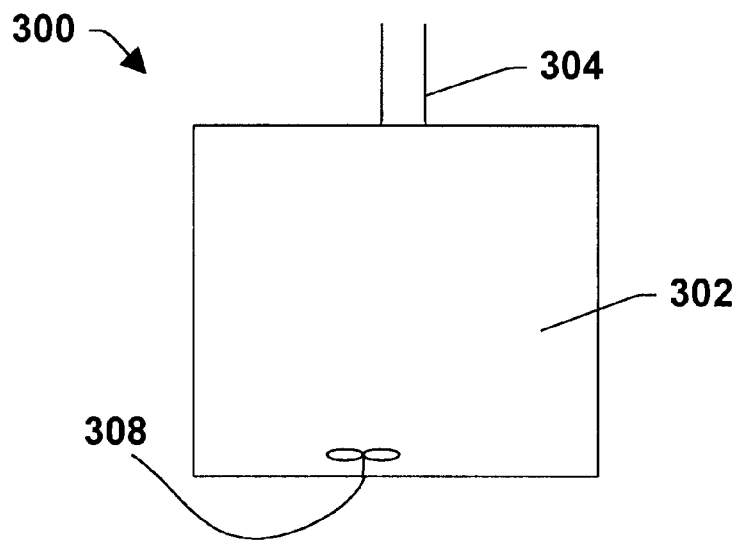
FIG. 6 illustrates a storage device containing a mixture of abrasive particles and water in accordance with another aspect of the present invention.
Figure 7:
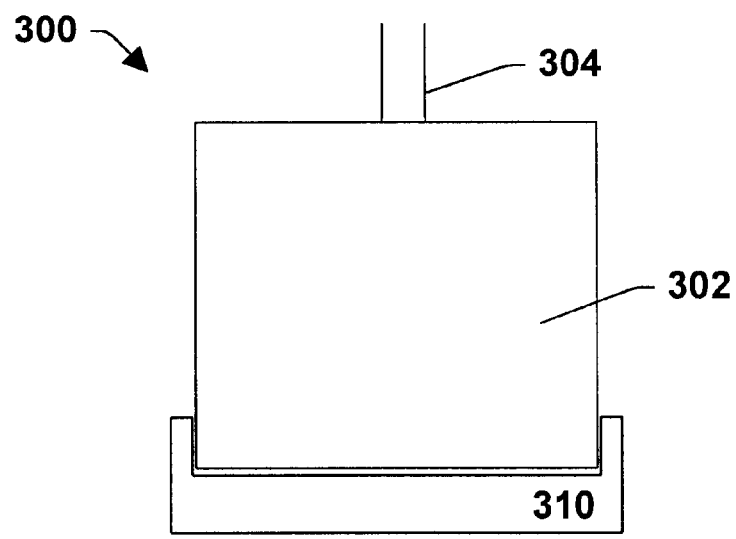
FIG. 7 illustrates a storage device containing a mixture of abrasive particles and water in accordance with yet another aspect of the present invention.

The wet abrasive injection system preferably contains a suitable form of agitation to keep the abrasive particles suspended in water. A substantially homogenous suspension promotes even and consistent cutting by the water jet cutting system. The mixture of abrasive particles and water may be directly agitated by an internal agitator or externally where the storage device may be agitated thereby agitating the mixture contained therein or through another external device such as an ultrasonic agitator. Several alternative embodiments are shown in FIGS. 5 to 7. Notwithstanding these embodiments, other suitable means of agitation may be employed.

Referring to FIG. 5, a storage device 300 containing the mixture of abrasive particles and water has a container 302 and a delivery tube 304 for delivering the mixture from the storage device 300 to the cutting head (not shown). The storage device 300 is equipped with a tube 306 for expelling water which promotes suspension of the abrasive particles in water.

Referring to FIG. 6, a storage device 300 containing the mixture of abrasive particles and water has a container 302 and a delivery tube 304 for delivering the mixture from the storage device 300 to the cutting head (not shown). The storage device 300 is equipped with a mechanical stirring device 308, such as a stirring bar or propeller, for stirring water which promotes suspension of the abrasive particles in water. The mechanical stirring device 308 may be operator by motor or magnetic means.

Referring to FIG. 7, a storage device 300 containing the mixture of abrasive particles and water has a container 302 and a delivery tube 304 for delivering the mixture from the storage device 300 to the cutting head (not shown). The storage device 300 is equipped with or connected to an agitating device 310, such as a mechanical shaker or an ultrasonic agitator, for agitating the water which promotes suspension of the abrasive particles in water.

The suspension of abrasive particles (wet injection) moves at speeds greater than dry abrasive particles (dry injection) due to the presence of water, and thus the tendency for abrasive particles to clog the nozzle orifice (or other portions of the cutting head) is significantly reduced. Consequently, the size of abrasive particles can be reduced and/or nozzle orifice diameters can be reduced. Smaller abrasive particles provide comparably smaller diameter jet streams and a reduction in substrate cracking and chipping thereby enhancing cutting and machining precision by producing smaller kerfs. Smaller orifices provide also comparably smaller diameter jet streams enhancing cutting and machining precision by producing smaller kerfs and decreasing media consumption rates.

The wet abrasive injection system or the water jet cutting system delivers the mixture of abrasive and water to the cutting head via a delivery tube, supply line, or similar device. In this connection, the wet abrasive injection system or the water jet cutting system may contain a pump or vacuum system to transfer the mixture of abrasive and water to the cutting head. Externally fitted pumps such as a piston displacement pump, internal pumps, venturi vacuum, and the like may be employed.

The wet abrasive injection system or the water jet cutting system may contain a measuring or metering device to inject a desired amount of the abrasive mixture into the water stream. The metering device takes into account the amount of abrasive suspended in water in the storage device and the amount of water supplied from the water supply to the cutting head, and injects an appropriate amount of the abrasive mixture into the water stream.

Any suitable material can be employed as the abrasive particle, provided certain size and/or hardness parameters are met. One of the advantages of the present invention is that relatively small abrasive particles can be used while minimizing clogging of the cutting head and nozzle in particular. That is, since the abrasive particles are introduced to the water stream using wet injection techniques, smaller sized abrasives may be employed.

In one embodiment, the abrasive particles have an average diameter of about 0.1 $\mu$m or more and about 1,000 $\mu$m or less. In another embodiment, the abrasive particles have an average diameter of about 1 $\mu$m or more and about 200 $\mu$m or less. In yet another embodiment, the abrasive particles have an average diameter of about 75 $\mu$m or less (about 200 grit, U.S. Standard Sieve Series). In still yet another embodiment, the abrasive particles have an average diameter of about 63 $\mu$m or less (about 230 grit, U.S. Standard Sieve Series). In another embodiment, the abrasive particles have an average diameter of about 53 $\mu$m or less (about 270 grit, U.S. Standard Sieve Series).

In one embodiment, the abrasive particles have an average Mohs' harness of about 5 or more. In another embodiment, the abrasive particles have an average Mohs' harness of about 6 or more. In yet another embodiment, the abrasive particles have an average Mohs' harness of about 6.5 or more.

Examples of materials employed for the abrasive particles include one or more of alumina, ceramic powders, corundum, diamond, garnet, olivine, silica, silicon carbide, tungsten carbide, and the like.

In the storage device, the amount of abrasive particles in the water can vary, but is such that an appropriate amount of abrasive particles can be delivered to the water stream. For example, the storage device typically contains at least about 10% by weight or more and about 90% by weight or less of abrasive particles in water. In another embodiment, the storage device typically contains at least about 20% by weight or more and about 80% by weight or less of abrasive particles in water. In the jet stream expelled from the cutting head of the water jet cutting system, the amount of abrasive particles in the water stream is about 2% by weight or more and about 60% by weight or less. In another embodiment, the amount of abrasive particles in the water stream is about 5% by weight or more and about 40% by weight or less.

A metering or measuring device may be coupled to the water jet cutting system so that a precise amount of abrasive particles in water can be used in the cutting stream. The metering device takes into account amount of abrasive particles in water delivered by the wet injection system and the flow rate of the high pressure water stream. A control system may be coupled to the metering device to vary the amount of abrasive particles in water to minimize cracking and chipping of the substrate and OICs on the substrate. The amount of abrasive particles in the water stream expelled from the cutting head/nozzle may be varied by controlling one or more of the amount of abrasive particles in the mixture supplied to the cutting head, the amount of the abrasive mixture supplied to the cutting head, and the amount of pressurized water supplied to the cutting head from the water source for combining with the abrasive mixture.

The cutting head contains a chamber where the abrasive mixture meets and is incorporated into the water stream to form a high pressure cutting jet which is expelled from the nozzle. Any type of cutting head may be employed so long as it permits the wet injection of the abrasive mixture.

Figure 8:
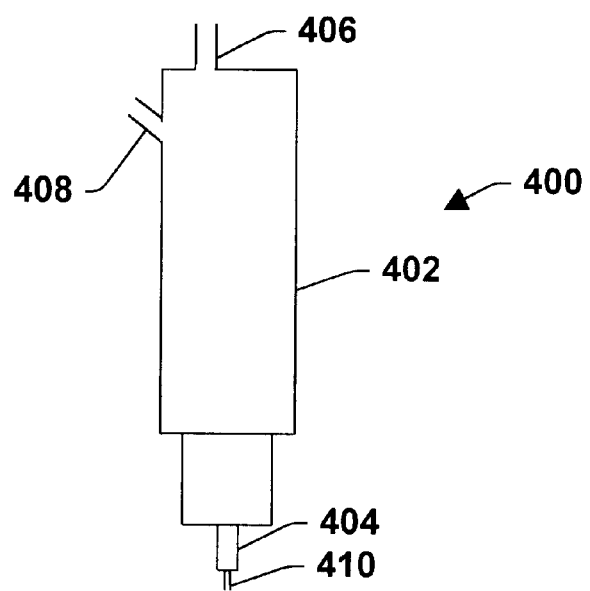
FIG. 8 illustrates a cutting head in accordance with one aspect of the present invention.

Referring to FIG. 8, an exemplary cutting head 400 is shown containing a mixing chamber 402, nozzle 404, high pressure water inlet 406, and at least one wet abrasive inlet 408. The mixture of water and abrasive particles is supplied to the cutting head 400 via the inlet 408, where it combines or otherwise is entrained by the high pressure water stream supplied to the cutting head 400 via the high pressure water inlet 406. The mixture of water and abrasive particles may also be supplied to the cutting head 400 under high pressure. Although not shown, the cutting head 400 may be equipped with two or more wet abrasive inlets 408. A cutting water jet 410 is formed as the water and abrasive is forced out of the cutting head 400 through the narrow orifice of the nozzle 404 under pressure.

In order to cut OICs using wet injection of abrasives while mitigating cracking and/or chipping of the substrate or the OICs thereon, a nozzle 404 having a diameter (internal diameter) of about 0.005 inches or more and about 0.05 inches or less is employed. In another embodiment, a nozzle 404 having a diameter of about 0.01 inches or more and about 0.03 inches or less is employed. Using such nozzles in accordance with the present invention, kerf diameters of about 0.05 inches or less are achieved. In another embodiment, kerf diameters of about 0.035 inches or less are achieved.

Furthermore, the pressure employed in order to cut OICs using wet injection of abrasives while mitigating cracking and/or chipping of the substrate or the OICs thereon is about 35,000 psi or more and about 75,000 psi or less. In another embodiment, the pressure employed in order to cut OICs is about 40,000 psi or more and about 70,000 psi or less.

Since relatively small abrasive particles may be employed, a finer cutting jet stream is emitted from the nozzle of the cutting head. As a result, narrower kerfs are realized when cutting OICs in accordance with the present invention. Additionally, since narrower kerfs are realized, more OICs may be formed on a given substrate, thus permitting increased integration and greater yields per wafer.

The substrates with OICs thereon that are cut in accordance with the present invention are made, at least in part, with brittle materials such as silica, monocrystalline silicon, silicon oxynitride, silicate glasses such as tetraethylorthosilicate (TEOS), and the like. Other silicate glasses include phosphosilicate glass (PSG), fluorosilicate glass (FSG), borophosphosilicate glass (BPSG), borophosphotetraethylorthosilicate (BPTEOS), germanium, germanium phosphosilicate, and germanium posophosphosilicate. The brittle nature makes the substrates and/or the OICs thereon readily susceptible to cracking and chipping, which often constitute fatal defects in the OICs (or substantially reduces the performance and/or reliability of the OICs). Since relatively small abrasive particles may be employed, a jet stream that mitigates and/or eliminates cracking and chipping in the substrate and/or OICs on the substrate.

The shape of the OICs on a given substrate is typically non-rectangular, but regular. Referring again to FIG. 1, a substrate with a plurality of OICs, in the case PLCs, is shown. When the shape of OICs is regular or consistent (substantially the same), they may be nested on the substrate to maximize the number of OICs fabricated on a given substrate. However, in order to maximize yield, curvilinear cutting must be employed. The present invention permits curvilinear (a line that is curved, not straight) cutting of brittle materials.

In order to conduct curvilinear cutting, either the substrate/workpiece is moved while the cutting head is held stationary, the cutting head is moved while the substrate/workpiece is held stationary, or both the substrate/workpiece and the cutting head are moved. Movement is made in at least two and preferably three dimensions relative to the substrate/workpiece and the cutting head.

Figure 9:
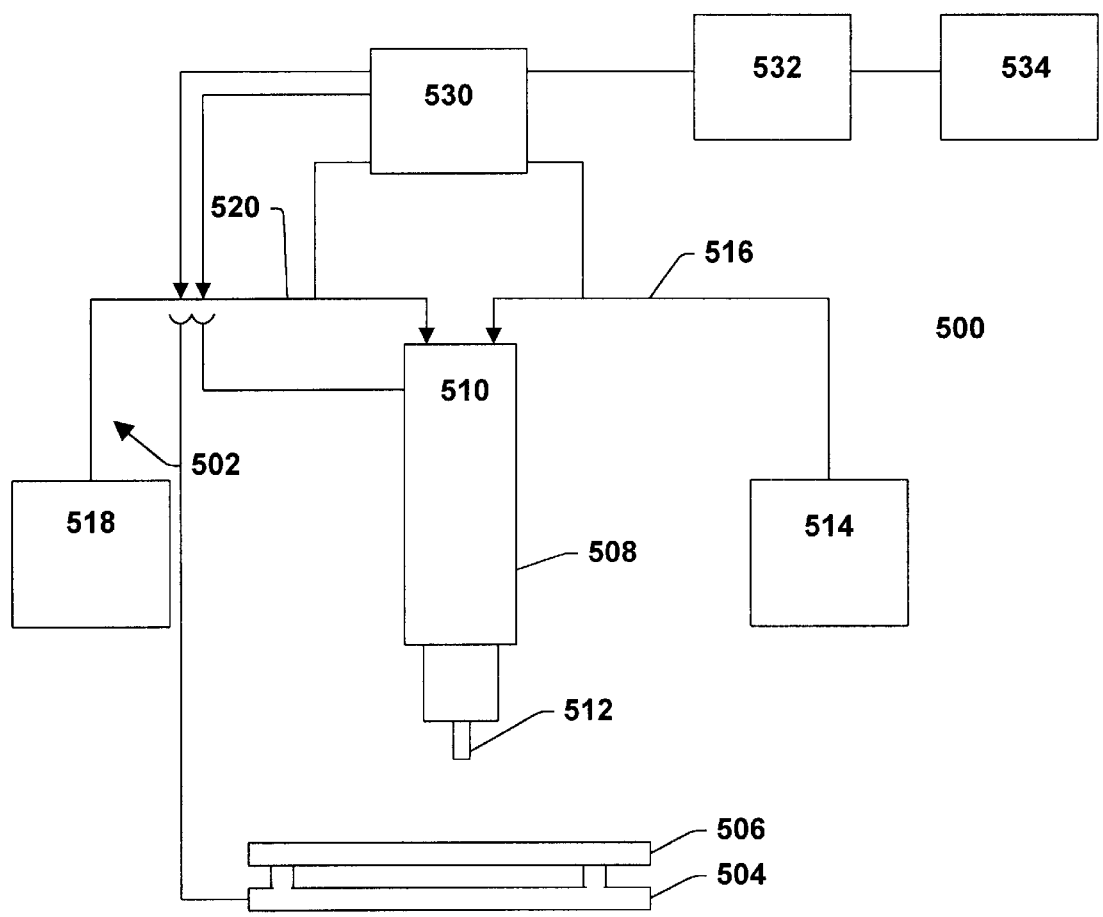
FIG. 9 illustrates a high level schematic of a water jet cutting system in accordance with another aspect of the present invention.

In another embodiment, processor control and/or automated feedback control is employed to dice OICs from a substrate. Referring to FIG. 9, a water jet cutting system 500 in accordance with another embodiment of the present invention is shown. Water jet cutting system 500 includes a substrate holder 504 for securing a substrate 506 that will be diced using the system 500. Water jet cutting system 500 also includes wet abrasive injection system 502, water supply 514 for supplying water used in the cutting operation, water supply tube 516 for delivering water from the water supply 514 to the cutting head 508, cutting head 508 including a mixing/receiving chamber 510 and nozzle 512. The wet abrasive injection system 502 includes a storage device 518 for housing a mixture of abrasive particles and water and a delivery tube 520 for delivering the mixture of abrasive particles and water from the storage device 518 to the cutting head 508.

Water jet cutting system 500 further includes or is coupled to controller 530, processor 532, and memory 534. Specifically, controller 530 is coupled to one or more of the water supply 514 or water supply tube 516 to provide a desired amount and pressure of water delivered from the water supply 514 to the cutting head 508; to the storage device 518 or delivery tube 520 to provide a desired amount under a desired pressure of the mixture of abrasive particles and water from the storage device 518 to the cutting head 508; to the substrate holder 504 to move/position the substrate 506 to desired locations and positions relative to the nozzle 512; to the cutting head to ensure desired amounts of water and mixture are combined in the cutting head 508 and to move/position the cutting head 508 to desired locations and positions relative to the substrate holder 504/substrate 506; and to the processor 532 for controlling the controller 530.

Processor 532 directs the activity of the controller 530 based on certain data, such as the identity and other parameters associated with the substrate 506, the identity of the OICs, the amount of abrasive in the mixture, the flow rate of the water in the cutting head 508, the width of the nozzle 512 orifice, the identity of the abrasive, the size of the abrasive, and the like, and the data is stored in memory 534. The processor 532 and memory 534 may be comprised by a computer.

In the cutting head 508, the mixture of abrasive particles and water from storage device 518 mixes and is entrained by the water traveling therethrough from the water supply 514. The controller 530 governs the amount of the mixture of abrasive particles and water from storage device 518 and the amount and flow rate of water from the water supply 514. The combination under suitable force forms a high pressure abrasive water jet as it is expelled from the nozzle 512 to cut, in a curvilinear manner, OICs from the substrate 506. The controller 530 governs the position/path at which the substrate 506 is held during water jet cutting.

Although the invention has been shown and described with respect to certain illustrated implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

In addition, while a particular feature of the invention may have been disclosed with respect to only one of several implementations, such feature may be combined with one or more other features of the other implementations as may be desired and advantageous for any given or particular application. As used in this application, the term "component" is intended to refer to a computer-related entity, either hardware, a combination of hardware and software, software, or software in execution. For example, a component may be, but is not limited to, a process running on a processor, a processor, an object, an executable, a thread of execution, a program, and a computer. Furthermore, to the extent that the terms "includes", "including", "with", "has", "having", and variants thereof are used in either the detailed description or the claims, these terms are intended to be inclusive in a manner similar to the term "comprising."

What is claimed is:

1. A method of cutting a brittle substrate comprising a non-rectangular shaped optical integrated circuit, comprising:
    providing the brittle substrate comprising a plurality of non-rectangular shaped optical integrated circuits on a water jet cutting system, the brittle substrate positioned proximate a cutting head of the water jet cutting system;
    supplying a high pressure water stream to the cutting head;
    wet injecting a mixture of water and abrasive particles into the water stream in the cutting head; and
    abrasive water jet cutting the brittle substrate in a curvilinear manner to separate at least one of the plurality of non-rectangular shaped optical integrated circuits without fatally damaging an adjacent optical integrated circuit.

2. The method according to claim 1, wherein the brittle substrate comprises one or more selected from the group consisting of monocrystalline silicon, silicon dioxide, silicon oxynitride, and silicate glasses.

3. The method according to claim 1, wherein the mixture comprises at least about 10% by weight or more and about 90% by weight or less of water and at least about 10% by weight or more and about 90% by weight or less of abrasive particles.

4. The method according to claim 1, wherein abrasive water jet cutting involves contacting the brittle substrate with a jet stream comprising at least about 40% by weight or more and about 98% by weight or less of water and at least about 2% by weight or more and about 60% by weight or less of abrasive particles.

5. The method according to claim 1, wherein the optical integrated circuit is a planar lightwave circuit.

6. The method according to claim 1, wherein the abrasive particles have an average diameter of about 53 $\mu$m or less and a Mohs' hardness of about 5 or more.

7. The method according to claim 1, wherein the abrasive particles comprise at least one selected from the group consisting of alumina, ceramic powders, corundum, diamond, garnet, olivine, silica, silicon carbide, and tungsten carbide.

8. A system for separating a plurality of non-rectangular shaped optical integrated circuits formed on a brittle substrate, comprising:
    a brittle substrate holder for holding the brittle substrate comprising the plurality of optical integrated circuits;
    a supply of a mixture of water and abrasive particles;
    an agitator to promote suspension of the abrasive particles in water in the supply;
    a water line from a water source to a cutting head;
    a second line from the supply of the mixture to the cutting head; and
    the cutting head comprising a chamber for receiving water from the water line and the mixture from the second line, the cutting head comprising a nozzle for expelling a jet stream under pressure for cutting the brittle substrate in a curvilinear manner, at least one of the brittle substrate holder and the cutting head movable in a curvilinear manner.

9. The system according to claim 8, wherein the agitator is a propeller.

10. The system according to claim 8, wherein the mixture comprises at least about 10% by weight or more and about 90% by weight or less of water and at least about 10% by weight or more and about 90% by weight or less of abrasive particles.

11. The system according to claim 8, wherein the abrasive particles have an average diameter of about 53 $\mu$m or less and a Mohs' hardness of about 5 or more.

12. The system according to claim 8, wherein the cutting head comprises a nozzle having an orifice with a diameter of about 0.005 inches or more and about 0.05 inches or less.

13. The system according to claim 8, further comprising a processor coupled to a controller, the controller coupled to the cutting head for metering a desired amount of the mixture of water and abrasive particles with water from the water supply.

14. A method of water jet cutting a silicon substrate in a curvilinear manner, comprising:
    providing the silicon substrate on a water jet cutting system, the silicon substrate positioned proximate a cutting head having a nozzle of the water jet cutting system;
    supplying a high pressure water stream to the cutting head;
    wet injecting a mixture of water and abrasive particles into the water stream in the cutting head to expel an abrasive water jet from the nozzle to contact the silicon substrate, wherein the abrasive particles have an average diameter of about 53 $\mu$m or less; and
    moving the silicon substrate in a curvilinear manner in relation to the cutting head to cut the silicon substrate in a curvilinear manner while reducing at least one of chipping the silicon substrate and cracking the silicon substrate.

15. The method according to claim 14, wherein the silicon substrate comprises a plurality of non-rectangular shaped optical integrated circuits, and each of the non-rectangular shaped optical integrated circuits is isolated by cutting the silicon substrate in a curvilinear manner.

16. The method according to claim 14, wherein the silicon substrate comprises silicon and at least one selected from the group consisting of silicon dioxide, silicon oxynitride, and silicate glasses.

17. The method according to claim 14, wherein the cutting head comprises a nozzle having an orifice with a diameter of about 0.005 inches or more and about 0.05 inches or less.

18. The method according to claim 14, wherein the abrasive water jet is expelled from the orifice at about 35,000 psi or more and about 75,000 psi or less.

19. The method according to claim 14, wherein the mixture comprises at least about 20% by weight or more and about 80% by weight or less of water and at least about 20% by weight or more and about 80% by weight or less of abrasive particles.

20. The method according to claim 14, wherein the abrasive water jet expelled from the orifice comprises at least about 40% by weight or more and about 98% by weight or less of water and at least about 2% by weight or more and about 60% by weight or less of abrasive particles.

* * * * *